United States Patent [19]

Perandi

[11] Patent Number: 5,017,884
[45] Date of Patent: May 21, 1991

[54] VACUUM TUBE AND MOSFET TRANSIMPEDANCE AMPLIFIER

[76] Inventor: Aado J. Perandi, 3864 Midland Ave., White Bear Lake, Minn. 55110

[21] Appl. No.: 430,170

[22] Filed: Nov. 1, 1989

[51] Int. Cl.$^5$ .............................................. H03F 5/00
[52] U.S. Cl. ............................................ 330/3; 330/98
[58] Field of Search ................. 330/3, 88, 89, 98, 100, 330/150, 152, 277, 300, 311

[56] References Cited

U.S. PATENT DOCUMENTS

| | | | |
|---|---|---|---|
| 3,949,316 | 4/1976 | Tsurushima | 330/300 |
| 4,163,198 | 7/1979 | Berning | 330/277 |
| 4,420,724 | 12/1983 | Owen | 330/277 |
| 4,553,108 | 11/1985 | Young | 330/300 |
| 4,647,872 | 3/1987 | Johnson | 330/311 |
| 4,801,893 | 1/1989 | Perandi | 330/300 |
| 4,918,394 | 4/1990 | Modafferi | 330/3 |

OTHER PUBLICATIONS

J. Roberts et al., "Instrument Output Amplifier".
J. A. Roberts et al., "M.O.S.-Bipolar Amplifiers", Wireless World, Jul. 1969.
N. Ya. Sedov, "A Universal Sepectrometric Preamplifier", *Instruments and Experimental Techniques*, vol. 19, No. 1, Pt. 2, pp. 153–154, Jan.–Feb. 1976; Plenum Publishing Corporation, New York.

*Primary Examiner*—Steven Mottola
*Attorney, Agent, or Firm*—Merchant, Gould, Smith, Edell, Welter & Schmidt

[57] ABSTRACT

An improved transimpedance amplifier includes a common cathode-connected vacuum tube first stage, coupled to a common-drain-connected MOSFET second stage, and an optional common drain-connected MOSFET third stage. Preferably, capacitive feedback is coupled from the output of the second stage to the input of the vacuum tube stage, to control the transimpedance of the amplifier. The circuit takes advantages of the low stray inter-electrode capacitances, low delay and transit times of the vacuum tube and the high transconductance of the MOSFET second and optional third stages, in a way complementary to one another to form a high transimpedance amplifier whose characteristics are controlled almost exclusively by the feedback capacitance or other feedback impedance, rather than by gain and stray capacitance terms of individual devices. The resulting transimpedance amplifier is useful in a number of applications, for example, in audio preamplifiers and audio power amplifiers.

15 Claims, 5 Drawing Sheets

VACUUM TUBE AND MOSFET TRANSIMPEDANCE AMPLIFIER

FIELD OF THE INVENTION

This invention pertains generally to the field of electronic amplifiers, and specifically to amplifier designs having advantageous forward transimpedance characteristics.

BACKGROUND OF THE PRIOR ART

Electronic amplifiers having favorable forward transimpedance characteristics are very useful in numerous fields including audio, video, communications, computers and control systems. An ideal transimpedance amplifier would transform an input current to an output voltage by a given ratio. An ideal transimpedance amplifier would have infinite frequency response, slew rate, voltage gain, current gain, and forward transconductance; zero input impedance, output impedance, input bias current, and distortion; unlimited available output current; and transimpedance characteristics which are determined only by a feedback impedance. Unfortunately, all real amplifier designs fall short of ideal characteristics to one degree or another, and such shortcomings affect the suitability of particular amplifier designs for particular applications.

Typical prior art transimpedance amplifiers use various combinations of bipolar transistors, connected in common emitter or emitter follower configurations, connected as a Darlington pair, or as a differential input amplifier stage. Depending upon the requirements for a particular application, such prior art circuits may suffice, or in some cases it may be possible to further improve them by adding additional stages and components, but at the disadvantage of added cost, complexity and in some cases distortion. In my prior U.S. Pat. application Ser. No. 905,841, now U.S. Pat. No. 4,801,893, I disclosed a series of improved transimpedance amplifiers using FET first stages followed by one or more bipolar stages. These amplifiers overcome most of the shortcomings of the above-noted prior art designs.

The present invention provides a different approach to transimpedance amplifier design, one that provides even further performance gains as compared to the above-noted designs, while maintaining the advantages of simplicity, ruggedness and low cost. The present invention makes use of a combination of a vacuum tube and one or more MOSFET devices, in a unique combination which takes advantage of important characteristics of both devices. Various combinations of vacuum tubes and semiconductor devices have been used before, but not in the configuration used in this invention. Those configurations are not appropriate for an improved transimpedance amplifier. See, for example, U.S. Pat. No. 4,163,198, which is a form of a series connection of a p-channel FET and a triode. This circuit differs from the present invention in that it does not invert phase, and consequently it cannot be used as a transimpedance amplifier.

SUMMARY OF THE INVENTION

By providing a unique combination of a vacuum tube first stage and a MOSFET second stage, with an optional MOSFET third stage, the present invention provides for an improved transimpedance amplifier having wider bandwidth and wider power bandwidth than could be provided using either all vacuum tubes or all MOSFETs. The invention takes advantages of unique properties of small signal vacuum tubes, i.e., low interelectrode capacitances and low transit and switching times, in combination with certain advantages provided by a MOSFET device, i.e., relatively high transconductance, to provide a high performance transimpedance amplifier.

Various combinations of vacuum tubes and MOSFETs have been used before, but not in the configuration used in this invention. Those configurations are not appropriate for an improved transimpedance amplifier.

DETAILED DESCRIPTION OF THE PREFERRED EMBODIMENTS

Figure 1:
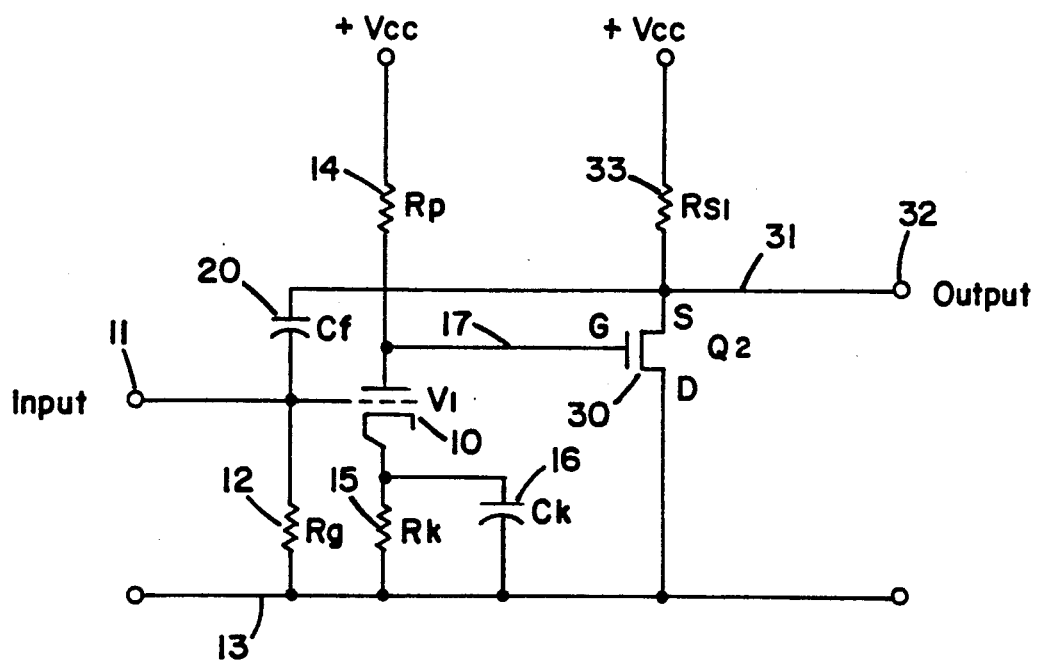
FIG. 1 is an electrical schematic diagram of one embodiment of a transimpedance amplifier according to the present invention.

The transimpedance amplifier of FIG. 1 includes a vacuum tube triode, generally indicated by reference number 10, and a MOSFET device, generally designated by reference number 30. A signal input terminal 11 connects to the grid of vacuum tube 10, and through a grid resistance 12 to signal ground 13. The plate of vacuum tube 10 connects through load resistance 14 to a positive voltage supply $+V_{cc}$. The cathode of vacuum tube 10 connects through a cathode resistance 15 to signal ground. This cathode resistance is bypassed by capacitance 16.

The plate of vacuum tube 10 is also connected via lead 17 to the gate electrode of MOSFET 30. The drain electrode of MOSFET 30 connects to signal ground 13, and the source electrode is connected to a lead 31. One branch of this lead connects to the output terminal 32. Another branch of lead 31 connects to feedback capacitance 20, the other side of which connects to the input terminal 11 and the grid of vacuum tube 10. A source resistor 33 is connected from lead 31 to a source of positive voltage $+V_{cc}$. Resistors 12 and 15 provide for grid and cathode biasing, respectively. Resistor 14 provides for the plate output loading. Resistor 33 provides for source output loading.

Vacuum tube 10 is connected in common cathode configuration, and as such provides voltage gain, with wide frequency response and wide power bandwidth. This advantageous result is obtained because the vacuum tube has low stray inter-electrode capacitances, and low delay and transit times. However, the vacuum tube stage by itself has relatively low transconductance. MOSFET 30 is connected in common drain configuration, and at this stage complements the first stage by providing high transconductance. The resulting combination circuit of FIG. 1 has high transimpedance, high transconductance, high voltage gain, and high current gain. Because of these factors, the transimpedance characteristics are determined almost exclusively by the feedback impedance capacitor 20, instead of being determined by the gain and stray capacitances of individual devices, as is often the case with prior art transimpedance amplifiers.

It should be noted that in general, under some circumstances it might be desirable to operate the circuit without any feedback impedance, i.e., by deleting capacitance 20. In other cases it may be desirable to have some generalized feedback impedance connected from the source of MOSFET 30 to the grid of vacuum tube 10, other than a simple capacitance. In the preferred embodiment shown, capacitance 20 provides for high-frequency lead phase compensation, which stabilizes the circuit containing the present invention against high frequency oscillations.

Figure 2:
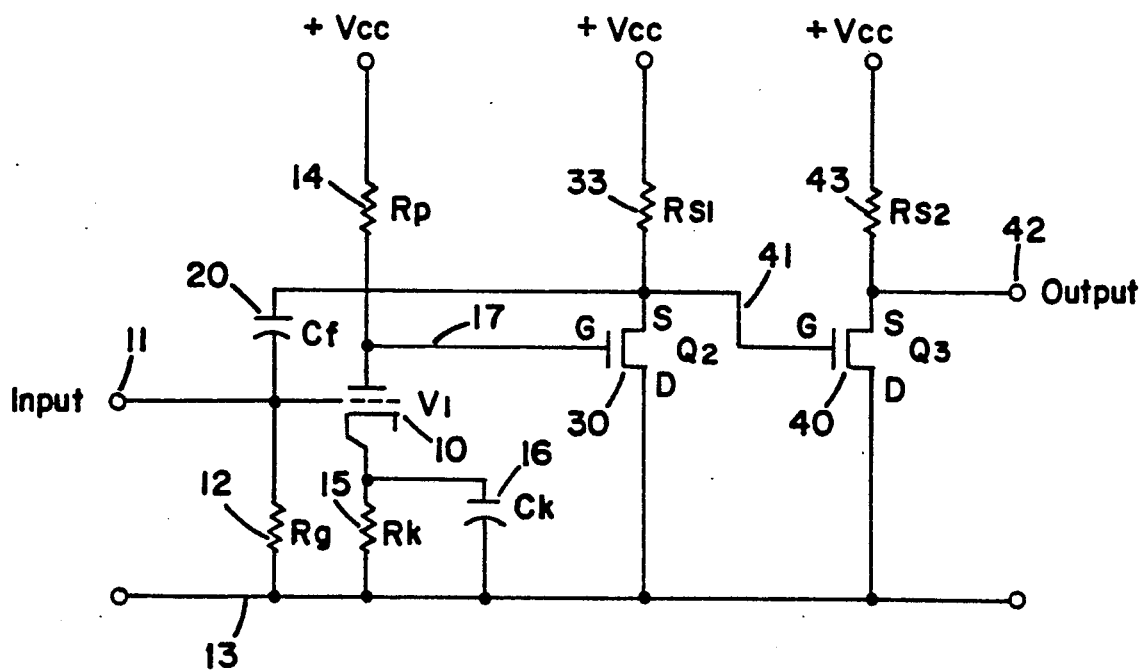
FIG. 2 is an electrical schematic diagram of another embodiment.

FIG. 2 shows a variation of the circuit of FIG. 1, including a third stage comprising MOSFET 40. The first two stages of the amplifier of FIG. 2, including vacuum tube 10 and MOSFET 30 and associated components, are identical to the circuit of FIG. 1, and individual components are given the same reference numbers. The additional, third stage consists of MOSFET 40 connected in common drain configuration, with the drain electrode connected to signal ground 13. The source electrode connects through source output load 43 to $+V_{cc}$. The output terminal 42 connects from the source electrode of MOSFET 40.

As in the case of the embodiment of FIG. 1, the feedback impedance, which in the preferred embodiment is a capacitor 20, connects from the source of second stage MOSFET 30 to the grid of first stage vacuum tube 10. Other types of impedances could be used, depending upon the particular application. The third stage provides additional current gain so that the transimpedance characteristics of the overall amplifier are determined by feedback impedance, capacitor 20, and are relatively independent of any loading connected to the output of the circuit.

Figure 3:
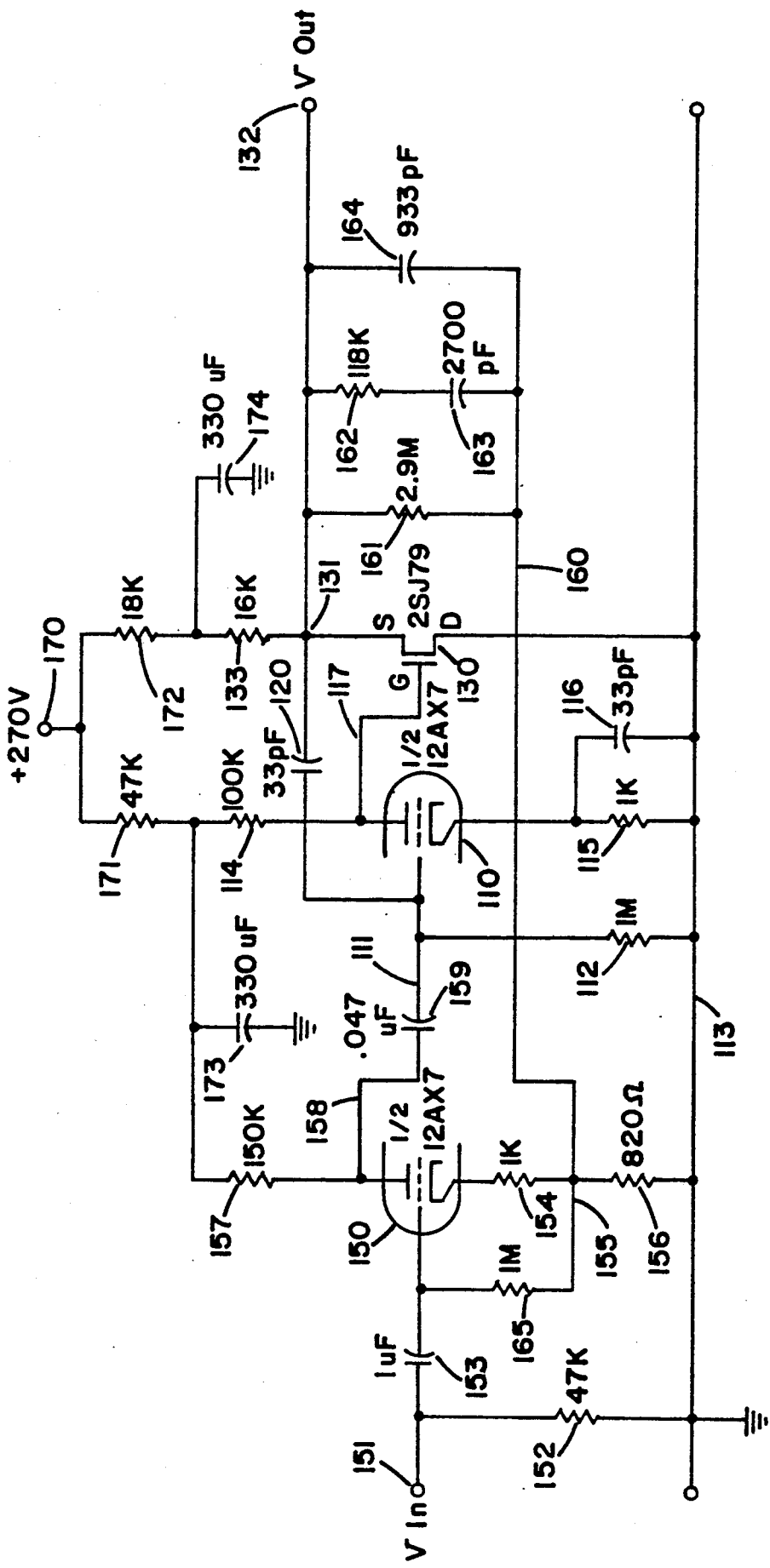
FIG. 3 is an electrical schematic diagram of RIAA phono preamplifier utilizing the transimpedance amplifier of FIG. 1.
Figure 4:
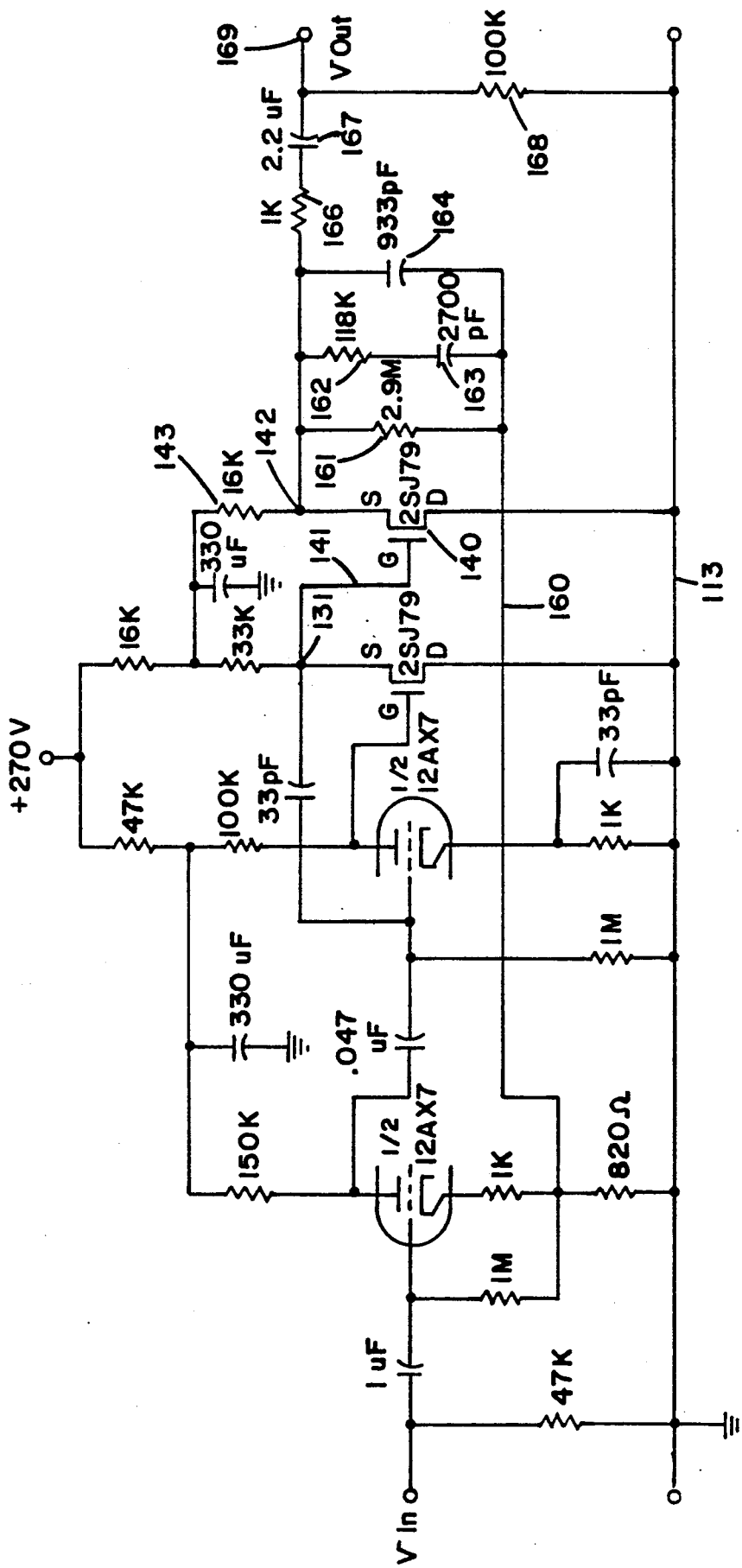
FIG. 4 is an RIAA phono preamplifier utilizing the transimpedance amplifier of FIG. 2.

The circuits of FIGS. 3 and 4 provide audio phonograph preamplifiers with RIAA equalization. They are suitable for receiving a signal from a phonograph cartridge, providing amplification and equalization, and providing an output signal for driving an audio power amplifier or other audio component. The circuits of FIGS. 3 and 4 are similar, but the circuit of FIG. 3 uses the two-stage transimpedance amplifier of FIG. 1, while the circuit of FIG. 4 uses the three-stage transimpedance amplifier of FIG. 2. Those skilled in the art will recognize that by using different feedback networks, different types of preamplifiers can be constructed.

In FIG. 3, the transimpedance amplifier comprises vacuum tube triode 110, MOSFET 130, and associated components. The input of this transimpedance stage is at lead 111, which connects to the control grid of vacuum tube 110. A grid resistor 112 connects to signal ground, 113. The cathode of vacuum triode 110 connects through cathode resistor 115, which is bypassed by cathode capacitance 116. The plate of triode 110 is connected to lead 117. It also connects through load resistor 114 to a source of operating voltage. Lead 117 couples signals from the plate of vacuum triode 110 to the gate electrode of MOSFET 130. The drain electrode of this MOSFET connects to signal ground, lead 113. Source resistor 133 connects from the source electrode to a source of positive operating potential, described below. Lead 131 is connected to the source electrode of MOSFET 130, which provides the signal output of the transimpedance amplifier, and of the entire phono preamplifier in this case. Feedback capacitance 120 for the transimpedance amplifier connects between lead 131 and the input lead 111 to the grid of vacuum triode 110. An input amplification stage is provided in front of the transimpedance amplifier, in the form of another vacuum triode 150. In practice, vacuum triodes 150 and 110 can be separate triodes in the same dual triode vacuum tube, type 12AX7. The input to the overall phono preamplifier of FIG. 3 can be provided between terminals 151 and signal ground 113. A load resistor 152 connects across this input, and a coupling capacitor 153 connects from input terminal 151 to the grid of triode 150. The cathode of triode 150 connects through a cathode resistor 154 to a node 155. A further resistor 156 connects from node 155 to signal ground. The plate of triode 150 connects through load resistor 157 to a source of positive operating voltage, described below. The plate also connects via lead 158 and series capacitor 159 to the input lead 111 of the transimpedance amplifier.

As previously mentioned, the output lead 131 for the transimpedance amplifier is also the output of the overall phono preamplifier and is connected to output terminal 132. A portion of the equalization network is connected in the form of feedback from this output to the phono preamplifier input stage 150. Specifically, a network consisting of resistors 161, 162 and capacitors 163, 164 is connected between lead 131 and the feedback lead 160. Feedback lead 160 connects to the previously mentioned node 155, and from there through resistor 154 to the cathode electrode of vacuum tube triode 150.

A source of suitable operating potential may be applied to bias terminal 170. A network including resistors 171, 172 and capacitors 173, 174 connect from terminal 170 and supply filtered operating voltage to load resistor 157 of input triode 150, load resistor 114 of transimpedance triode 110, and the source resistor 133 of the transimpedance MOSFET 130.

The phono preamplifier of FIG. 3 offers several advantages as compared with other types of amplifiers. These include lower distortion, better frequency response, and higher slew rates. This preamplifier also offers a reduction of output hum and better rejection of 60 Hz hum and other power supply noise and transients. These improvements are due to the ability of the transimpedance amplifier circuit to behave in a manner closer to the ideal than transimpedance amplifiers of the prior art, particularly in that its transimpedance characteristics are more nearly determined by the feedback impedance exclusive of other influences. In addition, this amplifier offers lower output impedance and higher current drive, allowing it to directly drive loads such as an equalization network without the need for a separate buffer amplifier.

The overall configuration of FIG. 4 is in many respects the same as FIG. 3, and the same reference numbers are used for the corresponding components in FIGS. 3 and 4. Such components in FIG. 4 perform essentially the same function as previously described with respect to their counterparts in FIG. 3, and therefore such description will not be repeated. Individual circuit component values may vary, however, for bias and equalization purposes as will be apparent to those skilled in the art. The main difference in FIG. 4 over the circuit of FIG. 3 is the inclusion of a third stage in the transimpedance section. Specifically, this is in the form of MOSFET 140 and associated connections. MOSFET 140 is connected in common drain configuration with its drain electrode connection connected to signal ground 113. Lead 131, from the source and signal output of MOSFET 130, connects via lead 141 to the gate of MOSFET 140. The source of MOSFET 140 connects to a lead 142. Source resistance 143 connects from this lead to the source of operating potential. The output of the transimpedance amplifier is thus at lead 142, and this connects through the equalizing network (resistors 161, 162 and capacitors 163, 164) to the feedback lead 160, as previously described. Lead 142 connects through series resistor 166 and capacitor 167 to output terminal 169 for the overall phono preamplifier. An output load resistor 168 connects from terminal 169 to signal ground.

The phono preamplifier of FIG. 4 offers all the advantages of the FIG. 3 amplifier as compared with other types of amplifiers. In addition, it provides further improvements in frequency response, slew rates, reduced sensitivity to device characteristics, as well as even lower output impedance and higher current drive.

Figure 5:
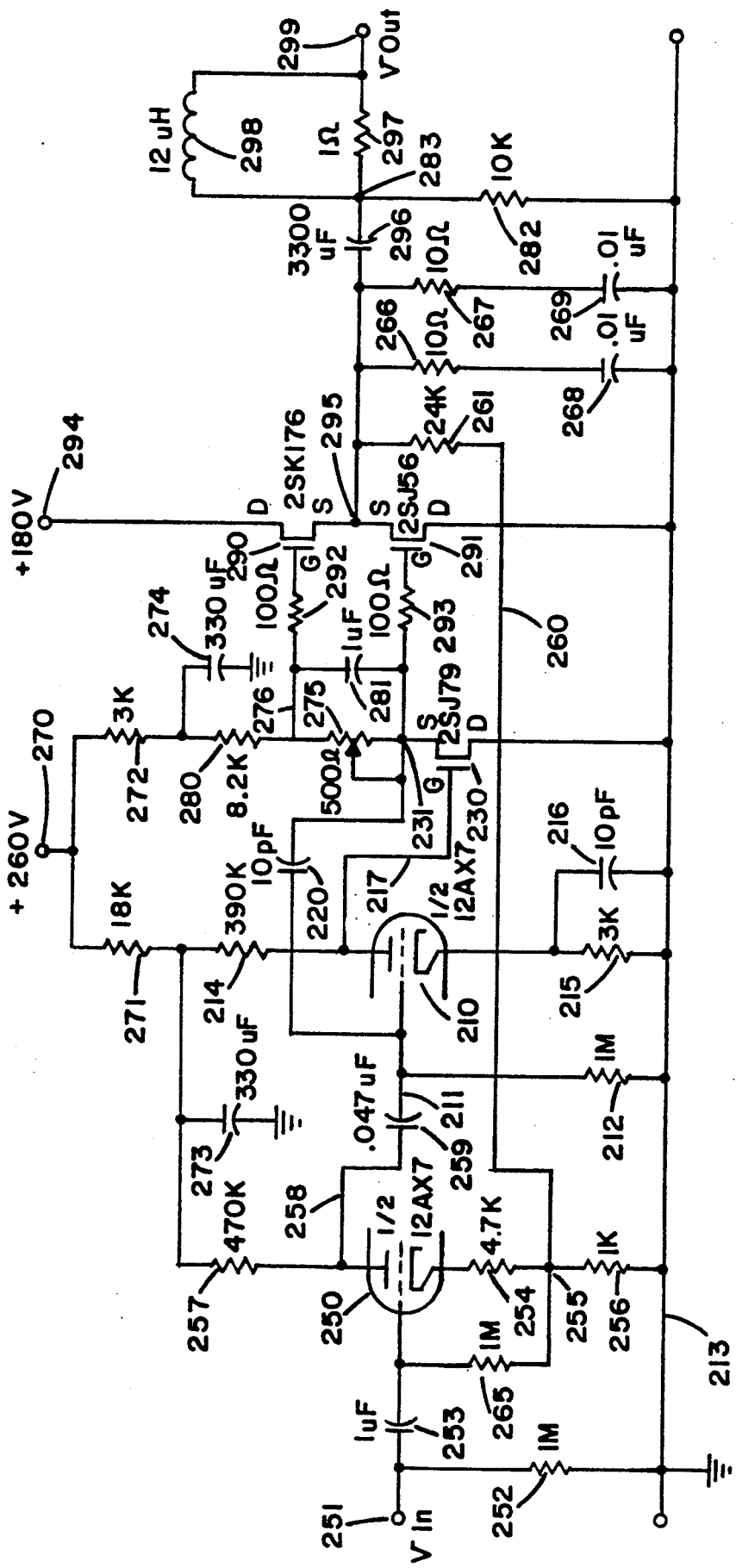
FIG. 5 is an electrical schematic diagram of an audio power amplifier utilizing the transimpedance amplifier of FIG. 1.

Another use of the transimpedance amplifier of the present invention is as an interstage driver in an audio power amplifier. In FIG. 5, the transimpedance amplifier consists of vacuum tube triode 210, MOSFET 230, and associated components. Specifically, the input to the transimpedance amplifier is at lead 211, which connects to the grid of triode 210. As before, triode 210 can be one-half of a dual triode vacuum tube such as a 12AX7. The output of the transimpedance amplifier stage is at lead 231, which is the source of MOSFET 230. Other components of the transimpedance amplifier stage include grid resistor 212, cathode resistor 215, bypass capacitor 216, interconnection lead 217, feedback capacitance 220, and plate load resistor 214. The source load resistor for MOSFET 230 includes a pair of resistors which also help set the bias conditions for the output transistors. Variable resistor 275 connects from lead 231 to a lead 276, and a resistor 280 connects from there to a source of positive potential. Together these two resistors form the source load for MOSFET 230.

An input stage is provided for the power amplifier of FIG. 5, including triode 250 which, for convenience, can be the other half of a dual triode vacuum tube that also includes triode 210. The input terminal 251 for the power amplifier couples through series capacitor 253 to the grid of triode 250. Input resistor 252 connects from the input to signal ground 213. The cathode of triode 250 connects through cathode resistor 254 to a node 255. Resistor 256 connects from this node to signal ground. The plate of triode 250 connects through load resistor 257 to the source of operating potential, and also through a lead 258 and series coupling capacitor 259 to the input 211 of the transimpedance amplifier.

As previously mentioned, the output of the transimpedance amplifier stage is at lead 231. This is coupled through gate resistor 293 to MOSFET power output device 291. The signal is also coupled through variable resistor 275 and bypass capacitor 281 to gate resistor 292 of power output MOSFET device 290. The drain of device 290 is connected to a source of positive operating potential 294, and the source of device 290 is connected to a lead 295. The source of device 291 is also connected to lead 295, and the drain of device 291 connects to signal ground.

Lead 295 connects through series capacitor 296 and parallel-connected resistor 297 and inductance 298 to the power amplifier output terminal 299. A feedback path is coupled from lead 295 through resistor 261, lead 260, node 255, and resistor 254 to the cathode of input triode 250. Resistor 266 and capacitor 268, and resistor 267 and capacitor 269 provide two paths from lead 295 to signal ground, so as to stabilize power output MOSFET devices 290 and 291 against high frequency oscillations. Resistor 282 connects from lead 283 to signal ground.

The power supply for the input amplifier 250 and the transimpedance amplifier is applied to a power terminal 270 and distributed by the filtering network which includes resistors 271, 272 and capacitors 273, 274.

In operation, signals applied to the input terminal 251 of the power amplifier are initially amplified by the stage including triode 250, then are further amplified by the transimpedance amplifier, which then drives the output power devices 290, 291.

The power amplifier of FIG. 5 offers several advantages as compared with other types of amplifiers. These include lower distortion, better frequency response, and higher slew rates. This power amplifier also offers a reduction of output hum and better rejection of 60 Hz hum and other power supply noise and transients. These improvements are due to the ability of the transimpedance amplifier circuit to behave in a manner closer to the ideal than transimpedance amplifiers of the prior art, particularly in that its transimpedance characteristics are more nearly determined by the feedback impedance exclusive of other influences. In addition, because the transimpedance amplifier offers lower output impedance and higher current drive, it can directly drive the output circuitry without the need for a separate buffer amplifier.

Figure 6:
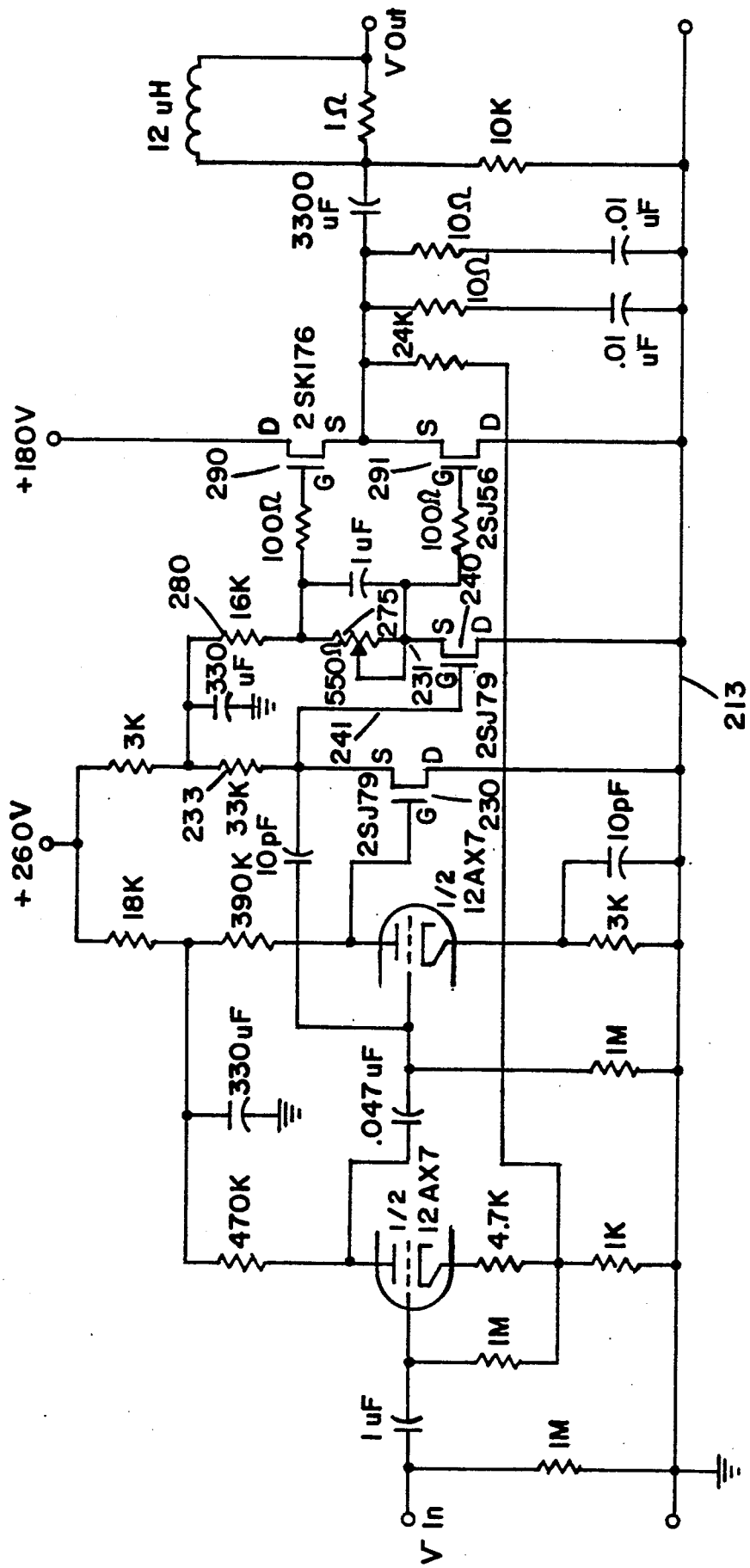
FIG. 6 is an electrical schematic diagram of an audio power amplifier utilizing the transimpedance amplifier of FIG. 2.

The power amplifier of FIG. 6 is the same as the power amplifier of FIG. 5, with the addition of a third stage to the transimpedance amplifier. Otherwise, all components are the same in the amplifiers of FIGS. 5 and 6, and are given the same reference numbers in both Figures.

The added third stage includes MOSFET 240, which is connected between MOSFET 230 and the output circuitry of the power amplifier. Specifically, the drain of MOSFET 240 is connected to signal ground 213, and the gate electrode is connected via lead 241 from the source electrode of MOSFET 230. Resistor 233 is connected as the source load resistor for MOSFET 230, connecting to the source of operating potential. Variable resistor 275 and resistor 280 are connected as the source load resistance for MOSFET 240. As before, these resistors also set the offset bias for output devices 290, 291.

The power amplifier of FIG. 6 operates in the same manner as previously described for FIG. 5, except that the addition of the third stage, i.e., MOSFET 240, in the transimpedance amplifier provides additional isolation and current drive for the output stages.

The power amplifier of FIG. 6 offers all the advantages of the FIG. 5 amplifier as compared with other types of amplifiers. In addition, it provides further improvements in frequency response, slew rates, reduced sensitivity to device characteristics, as well as even lower output impedance and higher current drive.

While the above examples have used vacuum triodes, it will be appreciated that other types of vacuum tubes could also be used.

Thus it will be seen that the present invention has provided an improved transimpedance amplifier not heretofore recognized in the art, and which provides improved performance compared to prior art designs. The invention accomplishes this by taking advantages of unique properties of vacuum triodes and MOSFETs, and combining them in a unique way so that these characteristics complement one another to achieve the improved performance.

What is claimed:

1. An amplifier having improved forward transimpedance characteristics, comprising:
   a vacuum tube first amplification stage;
   a MOSFET second amplification stage;
   input means for applying signals to be amplified to said first amplification stage;
   means for coupling signals from the output of said first amplification stage to the input of said second amplification stage;
   a MOSFET third amplification stage and means for coupling signals from the output of said second amplification stage to said third amplification stage;
   output means connected to receive amplified signals from the third amplification stage;
   feedback means connected to convey negative feedback signals from the output of said second amplification stage to said input means.

2. An improved forward transimpedance amplifier, comprising:
   a first amplification stage including a common cathode connected vacuum tube;
   a second amplification stage including a common drain connected MOSFET;
   input means for applying signals to be amplified to a control grid of said vacuum tube;
   means for coupling signals from the plate of said vacuum tube to the gate of said MOSFET;
   output means connected to receive amplified signals from the source of said MOSFET; and
   means for coupling feedback signals from the amplifier output at the source of the MOSFET to the grid of said vacuum tube, said feedback means including a capacitor.

3. An improved forward transimpedance amplifier, comprising:
   a first amplification stage including a common cathode connected vacuum tube;
   a second amplification stage including a common drain connected MOSFET;
   a third amplification stage including a common drain connected MOSFET;
   input means for applying signals to be amplified to a control grid of said vacuum tube;
   means for coupling signals from the plate of said vacuum tube to the gate of the second amplification stage MOSFET;
   means for coupling signals from the source of the second amplification stage MOSFET to the gate of the third amplification stage MOSFET;
   output means connected to receive amplified signals from the source of said MOSFET; and
   means for coupling feedback signals from the source of the second amplification MOSFET to the grid of said vacuum tube, said feedback means including a capacitor.

4. A preamplifier comprising:
   a first amplification stage;
   a second amplification stage including a common cathode connected vacuum tube;
   a third amplification stage including a common drain connected MOSFET;
   input means for applying signals to be amplified to a control input of said first amplification stage;
   means for coupling signals from the output of said first amplification stage to a control grid of the vacuum tube of said second amplification stage;
   means for coupling signals from the plate of the vacuum tube of said second amplification stage to the gate of said MOSFET;
   output means connected to receive amplified signals from said third amplification stage;
   first feedback means connected to convey negative feedback signals from the output of said third amplification stage to said second amplification stage;
   frequency compensation means connected to said output means for providing a negative feedback signal; and
   second feedback means connected to convey said negative feedback signals from said frequency compensation means to said first amplification stage.

5. A preamplifier according to claim 4, wherein said first feedback means comprises a capacitance.

6. A preamplifier according to claim 4, wherein said first amplification stage includes a common cathode connected vacuum tube.

7. A preamplifier comprising:
   a first amplification stage;
   a second amplification stage including a common cathode connected vacuum tube;
   a third amplification stage including a common drain connected MOSFET;
   a fourth amplification stage including a common drain connected MOSFET;
   input means for applying signals to be amplified to a control input of said first amplification stage;
   means for coupling signals from the output of said first amplification stage to a control grid of the vacuum tube of said second amplification stage;
   means for coupling signals from the plate of the vacuum tube of said second amplification stage to the gate of the MOSFET of said third amplification stage;
   means for coupling signals from the output of said third amplification stage to the gate of the MOSFET of said fourth amplification stage;
   output means connected to receive amplified signals from said fourth amplification stage;
   first feedback means connected to convey negative feedback signals from the output of said third amplification stage to said second amplification stage;
   frequency compensation means connected to said output means for providing a negative feedback signal; and
   second feedback means connected to convey negative feedback signals from said frequency compensation means to said first amplification stage.

8. A preamplifier according to claim 7, wherein said first feedback means comprises a capacitance.

9. A preamplifier according to claim 8, wherein said first amplification stage includes a common cathode connected vacuum tube.

10. A power amplifier comprising:
    a first amplification stage;

a second amplification stage including a common cathode connected vacuum tube;

a third amplification stage including a common drain connected MOSFET;

a power amplification stage capable of driving an output load;

input means for applying signals to be amplified to a control input of said first amplification stage;

means for coupling signals from the output of said first amplification stage to a control grid of the vacuum tube of said second amplification stage;

means for coupling signals from the plate of the vacuum tube of said second amplification stage to the gate of the MOSFET of said third amplification stage;

means for coupling signals from the output of said third amplification stage to the input of said power amplification stage;

output means connected to receive amplified signals from said power amplification stage;

first feedback means connected to convey negative feedback signals from the output of said third amplification stage to said second amplification stage; and second feedback means connected to convey negative feedback signals from said power amplification stage to said first amplification stage.

11. A power amplifier according to claim 10, wherein said first feedback means comprises a capacitance.

12. A power amplifier according to claim 10, wherein said first amplification stage includes a common cathode connected vacuum tube.

13. A power amplifier comprising:
a first amplification stage;
a second amplification stage including a common cathode connected vacuum tube;
a third amplification stage including a common drain connected MOSFET;
a fourth amplification stage including a common drain connected MOSFET;
a power amplification stage capable of driving an output load;
input means for applying signals to be amplified to a control input of said first amplification stage;
means for coupling signals from the output of said first amplification stage to a control grid of the vacuum tube of said second amplification stage;
means for coupling signals from the plate of the vacuum tube of said second amplification stage to the gate of MOSFET of said third amplification stage;
means for coupling signals from the output of said third amplification stage to the gate of the MOSFET of said fourth amplification stage;
means for coupling signals from the output of said fourth amplification stage to the input of said power amplification stage;
output means connected to receive amplified signals from said power amplification stage;
first feedback means connected to convey negative feedback signals from the output of said third amplification stage to said second amplification stage; and
second feedback means connected to convey negative feedback signals from said power amplification stage to said first amplification stage.

14. A power amplifier according to claim 13, wherein said first feedback means comprises a capacitance.

15. A power amplifier according to claim 13, wherein said first amplification stage includes a common cathode connected vacuum tube.

* * * * *